United States Patent
Malek-Khosravi et al.

(10) Patent No.: US 8,893,063 B2
(45) Date of Patent: Nov. 18, 2014

(54) AREA AND POWER SAVING STANDARD CELL METHODOLOGY

(71) Applicant: QUALCOMM Incorporated, San Diego, CA (US)

(72) Inventors: Behnam Malek-Khosravi, La Jolla, CA (US); Michael Brunolli, Escondido, CA (US)

(73) Assignee: QUALCOMM Incorporated, San Diego, CA (US)

(*) Notice: Subject to any disclaimer, the term of this patent is extended or adjusted under 35 U.S.C. 154(b) by 0 days.

(21) Appl. No.: 13/859,512

(22) Filed: Apr. 9, 2013

(65) Prior Publication Data

US 2013/0214380 A1     Aug. 22, 2013

Related U.S. Application Data

(62) Division of application No. 12/754,074, filed on Apr. 5, 2010, now Pat. No. 8,423,930, which is a division of application No. 11/855,077, filed on Sep. 13, 2007, now Pat. No. 7,802,216.

(51) Int. Cl.
*G06F 17/50* (2006.01)
*H01L 27/04* (2006.01)

(52) U.S. Cl.
CPC .............. *G06F 17/505* (2013.01); *H01L 27/04* (2013.01)
USPC ............................. 716/104; 716/100; 716/102

(58) Field of Classification Search
USPC .......................................... 716/100, 102, 104
See application file for complete search history.

(56) References Cited

U.S. PATENT DOCUMENTS

| | | | |
|---|---|---|---|
| 6,857,110 B1 * | 2/2005 | Rupp et al. | 716/136 |
| 6,944,843 B2 | 9/2005 | Bansal | |
| 7,132,850 B2 | 11/2006 | Hashizume et al. | |
| 7,149,903 B1 * | 12/2006 | Chan et al. | 713/300 |
| 7,178,126 B2 | 2/2007 | Arai et al. | |
| 7,480,883 B2 | 1/2009 | Correale, Jr. et al. | |
| 7,627,839 B1 * | 12/2009 | Chan | 716/136 |
| 7,716,023 B2 * | 5/2010 | Barker et al. | 703/2 |
| 7,802,216 B2 | 9/2010 | Malek-Khosravi et al. | |
| 7,992,125 B2 | 8/2011 | Chen | |
| 8,020,130 B2 | 9/2011 | Nagata | |

(Continued)

FOREIGN PATENT DOCUMENTS

| | | |
|---|---|---|
| JP | 08339235 A | 12/1996 |
| JP | 2000195960 A | 7/2000 |

(Continued)

OTHER PUBLICATIONS

International Preliminary Report on Patentability—PCT/US2008/075632—KIPO—Mar. 25, 2010.

(Continued)

*Primary Examiner* — Vuthe Siek
*Assistant Examiner* — Magid Dimyan
(74) *Attorney, Agent, or Firm* — Knobbe Martens Olson & Bear LLP

(57) ABSTRACT

A semiconductor integrated circuit including a circuit for adaptive power supply regulation and designed using a process that increases operating speed used for characterizing circuit operation at a slow corner. In some embodiments a slow corner voltage is set to a higher than expected level for timing analysis performed by automated design tools.

12 Claims, 5 Drawing Sheets

(56) References Cited

U.S. PATENT DOCUMENTS

| | | |
|---|---|---|
| 8,423,930 B2 | 4/2013 | Malek-Khosravi et al. |
| 2002/0046388 A1 | 4/2002 | Shirata |
| 2003/0030483 A1 | 2/2003 | Seki et al. |
| 2004/0172603 A1 | 9/2004 | Collmeyer et al. |
| 2005/0034095 A1 | 2/2005 | Bansal |
| 2007/0113132 A1 | 5/2007 | Hosono |
| 2007/0234254 A1 | 10/2007 | Yoshimura |
| 2008/0263482 A1* | 10/2008 | Jin et al. ............ 716/5 |

FOREIGN PATENT DOCUMENTS

| | | |
|---|---|---|
| JP | 2001028013 A | 1/2001 |
| JP | 2003060052 A | 2/2003 |
| JP | 2004303882 A | 10/2004 |
| JP | 2005275783 A | 10/2005 |
| JP | 2007140773 A | 6/2007 |
| JP | 2007199951 A | 8/2007 |
| JP | 2007226664 A | 9/2007 |
| TW | 441110 B | 6/2001 |
| TW | 588229 B | 5/2004 |
| TW | 1262411 B | 9/2006 |
| TW | 1271031 B | 1/2007 |
| WO | 2009035950 | 3/2009 |

OTHER PUBLICATIONS

International Search Report and Written Opinion—PCT/US2008/075632—ISA/EPO—Jan. 29, 2009.

Lackey, D.E., et al. "Managing Power and Performance for System-on-chip Esigns using voltage Islands" IEEE/ACM International Conference on Computer Aided Design, 2002, ICCAD 2002, Nov. 10-14, 2002, pp. 195-202.

Taiwan Search Report—TW097135276—TIPO—May 23, 2012.

\* cited by examiner

AREA AND POWER SAVING STANDARD CELL METHODOLOGY

CROSS REFERENCE TO RELATED APPLICATIONS

This application is a divisional of U.S. patent application Ser. No. 12/754,074, filed on Apr. 5, 2010, now U.S. Pat. No. 8,423,930, which is a divisional of U.S. patent application Ser. No. 11/855,077, filed on Sep. 13, 2007, now U.S. Pat. No. 7,802,216. Both of these applications are incorporated by reference herein in their entireties.

BACKGROUND OF THE INVENTION

The present invention relates generally to semiconductor integrated circuits, and more particularly to design of semiconductor integrated circuits using standard cell methodologies.

Semiconductor integrated circuits are often very complex. The circuits may include thousands or even, millions of gates, in various groups performing a variety of functions. The gates often are designed to operate in a timed manner, with operation of the gates synchronized by one or more clock signals, with the speed of operation of the gates often dependent on manufacturing process variations, power supply voltage variations, and temperature variations.

Automated tools are often used in the design of the semiconductor integrated circuits in view of their complexity. The automated tools may provide various functions, but such tools often provide a designer the capability to specify circuit function at a relatively high level, with the tools decomposing the high level description to a low level implementation, determining placement of low level implementation components within a chip, and determining routing of signals within the chip.

Very often the automated tools use standardized components from a library of standardized components in decomposing the high level description to a low level implementation. Each standardized component may include several possible variations, for example variations of numbers of driving transistors, buffers, transistor length/width ratios, or other matters. The different standardized components may be used by the tools to increase speed of certain gates or to increase hold times to reach timing goals or for a variety of other reasons.

Proper timing operation of semiconductor integrated circuits is often very important, desired functions of the circuits may not be properly performed if timing goals of components of the circuitry and the circuitry as a whole are not met. Unfortunately, integrated circuits characteristics may vary chip to chip, although more commonly lot to lot, based on implantation variability, material impurities, or other factors, and in operation may vary based on operating voltage or temperature variations.

Automated tools, therefore, often check expected circuit timing against different locations on the expected curves of process, voltage and temperature variations. In many instances timing is checked against a "slow" position on the curves and a "fast" position on the curves, although some tools may check timing against a variety of points on the curves, or against multiple curves for each variable.

Generally the automated tools account for the timing variations by using different components from the library, or by insetting additional library elements to perform more operations in parallel. The tools may also place additional library components in a chain of elements to increase hold time. Often the changes result in higher power components, or additional power requiring components, and often the requirement for additional power is driven by a need to increase speed of switching or signal rise times. Increased number of components or size of components, however, often results in increased chip size requirements and power requirements, which are often undesirable.

SUMMARY OF THE INVENTION

The invention provides an area and power saving methodology for design of semiconductor integrated circuits. In one aspect the invention provides a method for use in designing integrated circuits, comprising specifying requirements for an integrated circuit, the requirements including a signal path providing for a speed comparison function, the speed comparison function affecting an operational characteristic of power lines of the integrated circuit; setting a voltage for a slow corner for use by an automated tool to a level higher than normal; and using the higher level to determine if a circuit design generated by the automated tool is expected to meet timing requirements for the integrated circuit.

In another aspect the invention provides a method for designing integrated circuits, comprising specifying requirements for an integrated circuit, the requirements including dynamic voltage scaling; translating the requirements to a register transfer level (RTL) description; and synthesizing the RTL description using a higher than normal voltage for characterization of a slow corner.

In another aspect the invention provides a method for designing integrated circuits, comprising receiving a register transfer level. (RTL) description of a circuit; synthesizing the RTL description by selecting cells from a standard cell library to implement functions in accordance with the RTL description, the selection of cells based in part on timing requirements indicated by the RTL description; and determining if the selected cells meet the timing requirements indicated by the RTL description for both a slow corner and a fast corner, the slow corner being determined at least in part by a slow process parameter, a slow voltage parameter, and a slow temperature parameter, the fast corner being determined at least in part by a fast process parameter, a fast voltage parameter, with the slow voltage parameter approximate the fast voltage parameter.

In another aspect the invention provides a semiconductor integrated circuit, the semiconductor integrated circuit including a circuit for adaptive voltage regulation, the semiconductor circuit including gates in standard cells selected by a process that uses a higher than normal voltage in performing timing analysis.

These and other aspects of the invention are more fully comprehended upon consideration of this disclosure.

DETAILED DESCRIPTION

Figure 1:
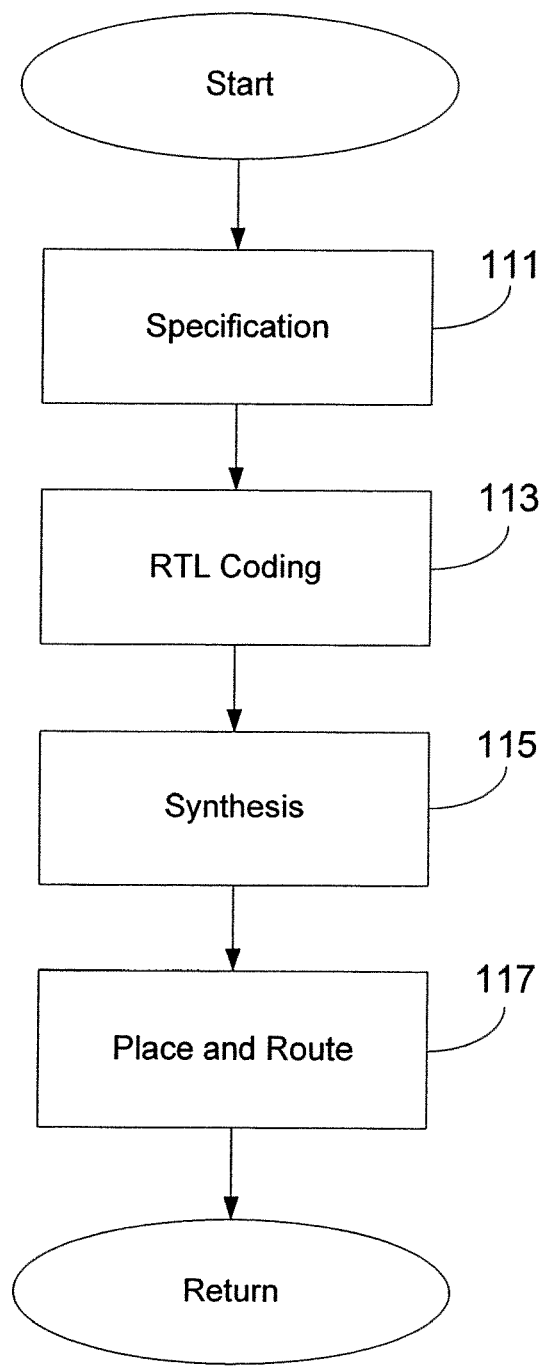
FIG. 1 is a flow diagram of a process for designing an integrated circuit in accordance with aspects of the invention.

FIG. 1 is a flow diagram of a process for designing a semiconductor integrated circuit. In block 111 specification is determined. Generally the specification specifies requirements for an integrated circuit. The specification may take a number of forms, and may be provided for example in the form of VHDL or Verilog code, although the VHDL or Verilog code may be based on the specification, or some other form. In block 113 the specification is translated to a register transfer language (RTL) description. In aspects of the invention the specification includes a circuit providing a signal delay of a predefined time. In addition, although not shown, a verification process may be employed to ensure consistency between the specification and the RTL description.

The RTL description is provided to a synthesis tool which synthesizes the RTL description in block 115. A variety of synthesis tools are available in the market place. Synthesis tools generally use scripts and a library of physical gate descriptions to create a logic gate level implementation of the semiconductor integrated circuit. In many instances the synthesis tool uses a standard cell implementation, with each standard cell of a generally predefined size and implementing different logic functions. Each standard cell is generally comprised of gate level circuits characterized at the transistor level for a given manufacturing process, and the characterization of the gate level circuits allows the synthesis tool to estimate different aspects of operation of the design as a whole in determining which of potentially different standard cells to use, how many to use, and other implementation details of implementation of the design.

In performing the synthesis operation, the synthesis tool will generally attempt to provide standard cells in such a manner that a resulting chip meets operational requirements, including timing requirements. As the chip may have different characteristics in view of normal manufacturing process variations, and the chip may be operating under different conditions such as different supply voltages or temperatures, the synthesis tool will generally attempt to provide a gate level description of the chip that meets timing requirements over an expected range of process, voltage, and temperature variations. Accordingly, the synthesis tool will often include a static timing analysis feature, although at time static timing analysis is performed by a separate tool. For purposes of FIG. 1 a static timing analysis feature is presumed to be provided by the synthesis tool, although in some embodiments it should be understood that this feature is provided as a separate tool that operates in a potentially iterative manner with the synthesis tool.

In an aspect of the invention the lowest voltage value in the expected range of voltage variations is increased and the highest voltage value in the expected range of voltage variations is decreased, although in various embodiments only one or the other may be done. For example, a synthesis tool may expect nominal supply voltages to range from a low voltage of 0.9 volts to a high voltage of 1.2 volts, with the voltages generally being rail to rail to rail voltages. In an aspect of the invention the synthesis tool may be informed that nominal supply voltages range from a low voltage of 1.0 volts to a high voltage of 1.1 volts, in some aspects of the invention the synthesis tool may be informed the nominal low voltage condition is the same as, or substantially the same as, the nominal high voltage condition, for example both could be 1.1 volts. Alternatively, the synthesis tool may be informed that nominal supply voltages range from a low voltage of 1.1 volts to a high voltage of 1.2 volts, or the synthesis tool may be informed that nominal supply voltages range from a low of 0.9 volts to a high of 1.0 volts.

In many instances verification is performed after synthesis to ensure that the gate level netlist provided by the synthesis tool is consistent with the RTL description and/or the specification. A variety of verification tools are available, and may be Binary Decision Diagram (BDD) based tools, automatic test pattern generation (ATPG) tools, or other tools or combinations of tools.

In block 117 the gate level synthesis is received by a place and route tool. The place and route tool determines placements of the cells in the semiconductor integrated circuit, and signal routing between the cells. For purposes of discussion, the place and route tool is assumed to include static and dynamic timing analysis features, which may operate in an iterative fashion with the place and route features of the tool. Again, the place and route tool may be informed that nominal supply voltage range from a low voltage to a high voltage, with in aspects of the invention the low voltage being specified as higher than would normally be expected for the low voltage and the high voltage being specified as lower than normally would be expected for the high voltage, or one or the other of the low voltage and the high voltage being so specified.

In some embodiments the process further includes production of a chip including the design. In some embodiments, and as illustrated in FIG. 1, the process thereafter returns, assuming the place and route tool is able to place the cells and meet design criteria. In some instances the place and route tool is unable to do so, and the process returns to the synthesis block for re-synthesis of the design and further operations.

In the process of FIG. 1, and in accordance with aspects of the invention, a circuit o use in adaptive power supply regulation is included as a specified component of the semiconductor integrated circuit. In some embodiments the circuit provides for adaptive power supply regulation, in some embodiments the circuit provides adaptive power supply regulation.

In one embodiment, the circuit for adaptive power supply regulation includes an on-chip circuit having a predefined nominal signal delay, which may vary due to process, voltage and temperature variations. The circuit may be implemented in a number of different ways, for example as a ring oscillator, a delay line (tapped or untapped) formed of a number of buffers and/or gates, or using other circuit elements. Tuning of voltage levels, in some embodiments performed by off-chip circuitry, provided as power to the on-chip circuit allows the circuit, and therefore the rest of the on-chip integrated circuits, to operate with a delay within desired operational limits.

Figure 2:
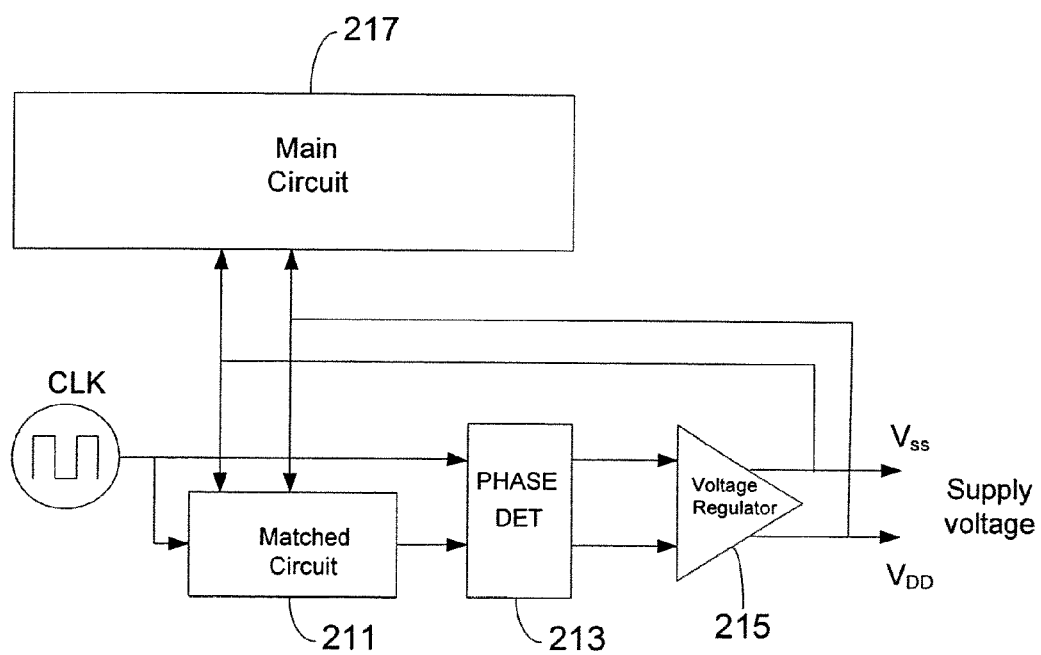
FIG. 2 is a block diagram of an integrated circuit including an example dynamic voltage scaling circuit in accordance with aspects of the invention.

An example block diagram for a circuit for adaptive power supply regulation is provided in FIG. 2. The example circuit of FIG. 2 provides rail voltage to a main circuit on the integrated circuit. In various embodiments, however, the circuit for adaptive power supply regulation may instead provide control signals for use by power supply circuitry in setting rail voltages.

The circuit of FIG. 2 includes a circuit, for convenience called a matched circuit 211, such as a ring oscillator, tapped delay line, or other circuit structure that provides a delay in signal propagation. The delay is generally based on process variations, namely variations in the manufacturing process for the integrated circuit, voltage variations, namely variations in supply voltages provided to the circuit, and temperature variations, namely variations in the operating temperature of the circuit.

A clock signal is provided to the matched circuit. The clock signal may be sourced by an off-chip clock source, although in many embodiments the clock signal is generated by an on-chip component, such as a PLL or DLL, potentially based on an off-chip lower frequency clock source. The matched circuit receives the input clock signal, and provides an output signal which is a delayed version of the input clock signal. Some of the delay in the clock signal provided by the matched circuit is due to the voltage levels of the power supply rails providing power to the matched circuit. The output of the matched circuit is received by a phase detector 213, which also receives the clock signal. The phase detector determines a phase difference between the output of the match circuit and the clock signal, with the phase difference indicative of the delay provided by the matched circuit. The phase detector provides up and down signals to a voltage regulator 215. The voltage regulator, based on the up-down signals, increases or decreases power supply voltages. The power supply voltages are provided to the matched circuit, with increasing power supply voltages expected to decrease the delay of the matched circuit. Accordingly, the voltage regulator, based on the phase detector inputs, drives the power supply rail voltages so as so have matched circuit processing speeds as desired with respect to the clock signal.

The power supply voltages are also provided to a main circuit 217. The main circuit includes the circuit structure as specified in a specification and implemented, for example, using the process of FIG. 1. Operating speed of the main circuit, therefore, may be adjusted to account for process variations and temperature variations through application of changes to power supply voltages.

Inclusion of an adaptive power supply regulation circuit in the design provides many benefits. One such benefit is, through use in the design process, for example allowing for increased slow corner voltage assumptions and/or decreased fast corner voltage assumptions, a smaller integrated circuit may be designed, which generally also indicates a reduction of power required by the circuit. Moreover, the adaptive power supply regulation circuit reduces periods of operation of the circuit at higher power levels. Both reduction in overall power required by the circuit and reduced periods of operation at higher power levels is likely to lead to increased reliability and operation life time of a chip. Further, in many instances design closure is easier to reach as place and route operations are more likely to result in a circuit meeting timing specifications, potentially avoiding a need for extensive re-work through re-synthesis of a design.

Figure 3:
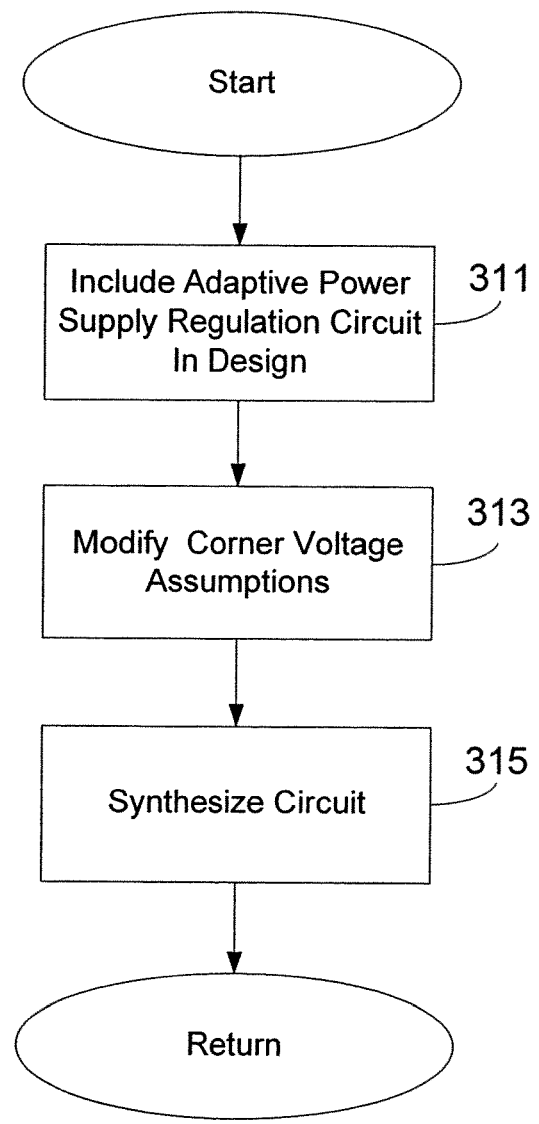
FIG. 3 is a further flow diagram of a process in accordance with aspects of the invention.

FIG. 3 is a further flow diagram of a process for improving circuit design. In block 311 an adaptive power supply regulation circuit is included in a specification for a semiconductor integrated circuit. Alternatively, a circuit for use in adaptive power supply regulation may be included, with off-chip circuitry expected to be used for power supply regulation in conjunction with the circuit for use in adaptive power supply regulation. In block 313, corner voltage assumptions for use by the synthesis tool are modified. Generally, the synthesis tool uses an assumed low power supply voltage (also generally with appropriate process and temperature parameters) for determining "slow" operation of a circuit, and an assumed high power supply voltage (again also generally with appropriate process and temperature parameters) for determining "fast" operation of a circuit, with a goal of correct circuit operation under both slow and fast conditions. In many embodiments both the slow corner voltage and the fast corner voltage assumptions are modified, with generally the slow corner voltage increased above a default or otherwise expected slow corner voltage and the fast corner voltage decreased below a default or otherwise expected fast corner voltage. In some such embodiments the slow corner voltage and the fast corner voltage are set to the same voltage, or substantially the same voltages, In some embodiments, however, only the slow corner voltage assumption is modified, while in other embodiments only the fast corner voltage assumption is modified. For example, in some embodiments the synthesis tool is provided an increased voltage for use in determining circuit speeds for a slow corner.

In block 315, the synthesis tool synthesizes the circuit using the slow corner voltage assumption. As this slow corner voltage assumption is higher than would normally be case, the synthesis tool is able to use smaller transistors and otherwise decrease cell count in determining cells for usage and characteristics of the cells. The use of smaller transistors and decreased cell count provides for a smaller semiconductor circuit that requires reduced power.

Figure 4:
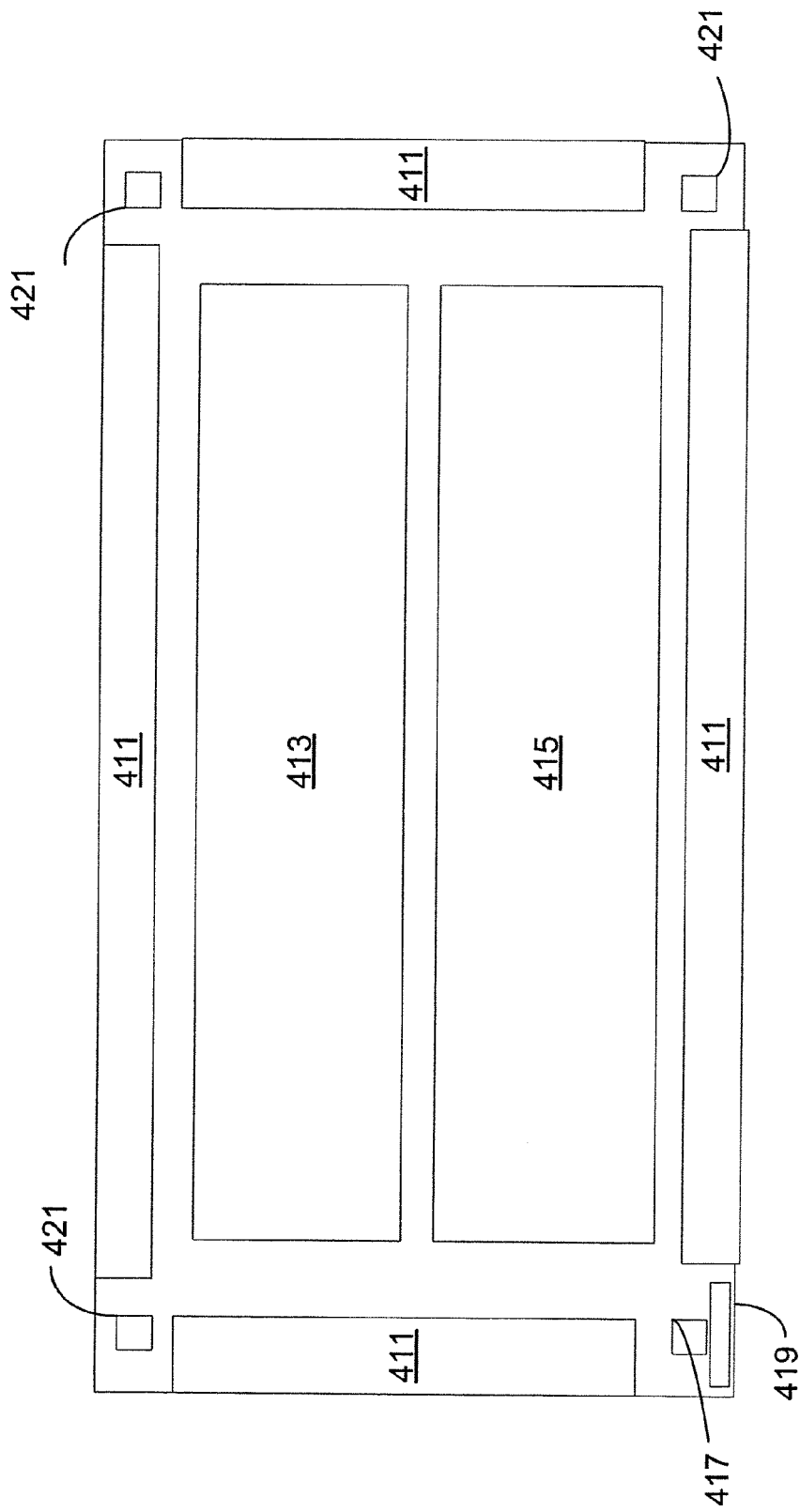
FIG. 4 is an illustrative view in semi-block diagram format of an integrated circuit in accordance with aspects of the invention.

FIG. 4 is a semi-block diagram of a chip including a semiconductor integrated circuit in accordance with aspects of the invention. The semiconductor integrated circuit includes an I/O ring 411, shown as about the periphery of the chip, as is often the case. Logic processing blocks 413 and 415 are shown as located about the interior of the chip. A power regulation block 417 is located in a corner of the integrated circuit. The power regulation block sets power levels on power lines, often called rails, of the chip. A delay line and comparison block 419 determines whether operating speed of the delay line indicates speed of circuit operation within a desired range of operating speeds. The delay line and comparison block provides one or more signals to the power regulation block indicating whether speed of circuit operation is too slow, and that therefore the power regulation block should increase power levels, too fast, and that therefore the power regulation block should decrease power levels, or within an appropriate range.

Figure 5:
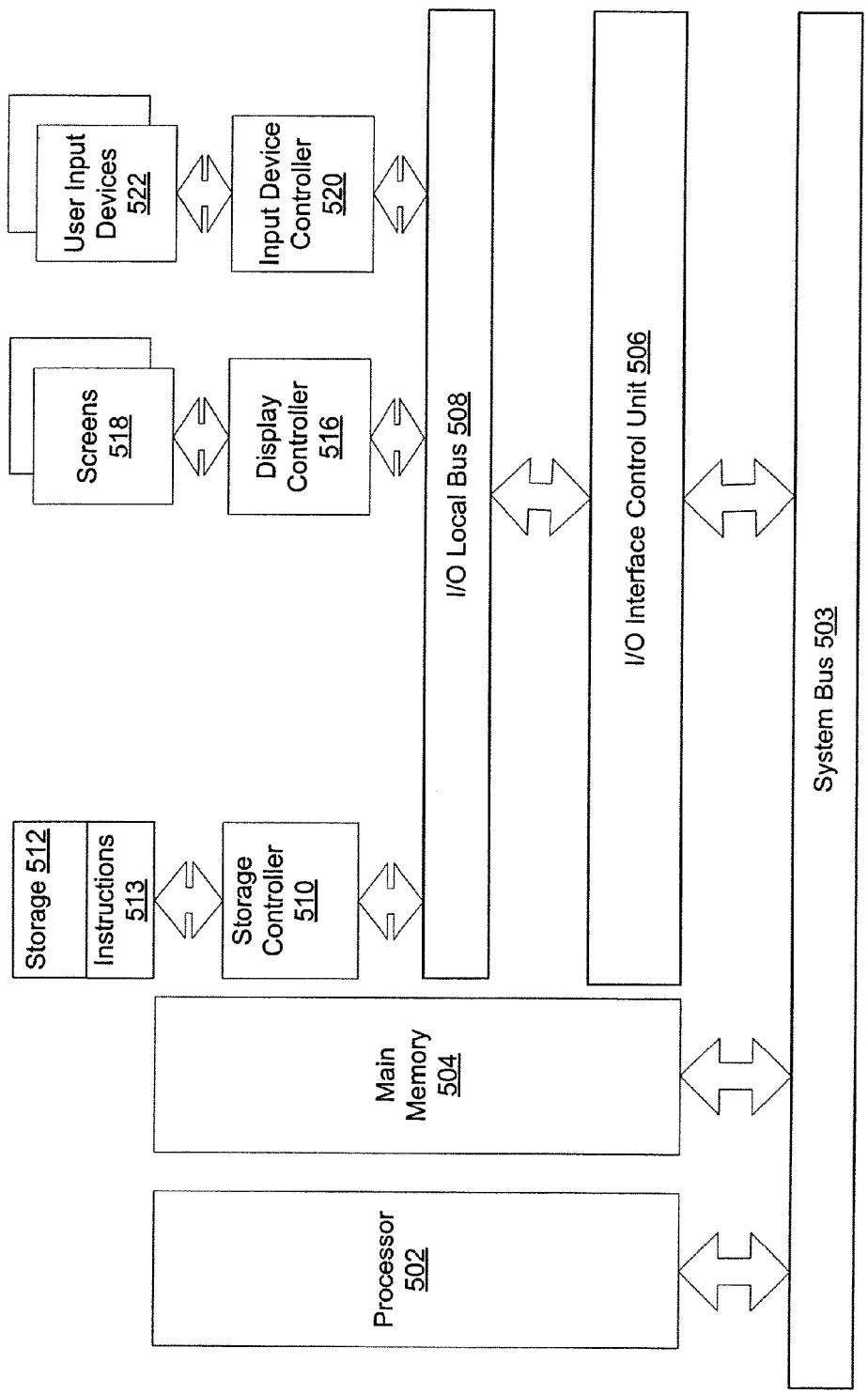
FIG. 5 is a block diagram of a computer system for performing design operations in accordance with aspects of the invention.

FIG. 5 is a block diagram of a computer system that may be used to perform operations in accordance with aspects of the invention. The computer system includes a processor 502. For convenience a single processor is shown, multiple processors may be used in some systems. The processor is operatively coupled via a system bus 503 to a main memory 404 and an I/O interface control unit 506. The I/O interface control unit is operatively coupled via an I/O local bus 508 to a storage controller 510. The system further includes one or more user input devices 522 coupled to the I/O local bus via an input device controller 520.

The processor is coupled via the I/O interface control unit, the I/O local bus, and the storage controller to a storage device 512. Computer program instructions 513, implementing for example design tools discussed herein, are stored on the storage device until the processor retrieves the computer program instructions and stores them, in the main memory. The processor executes the computer program instructions stored in the main memory to implement the processes discussed herein. For example, the processor receives design information from the user via for example the user input devices, or alternatively or additionally from the storage device, executes operations, for example synthesis and/or place and route operations, based on the program instructions on the design information, and stores resultant design information, for example a netlist or a final design, in the memory or storage device.

The data processing system further includes a plurality of display devices or screens 518 coupled to the I/O local bus via a display controller 516, The data processing system uses the display controller and display device to display information, for example the design information or the resultant design information.

Although the invention has been described with respect to certain embodiments, it should be recognized that the invention may be practiced otherwise than as specifically described. Accordingly, the invention should be viewed as the claims and their insubstantial variations supported by this disclosure.

What is claimed is:

1. A semiconductor integrated circuit, the semiconductor integrated circuit including a circuit for adaptive power supply regulation, the semiconductor integrated circuit including gates in standard cells selected by a process using an automated design tool that
   determines a first voltage for a slow corner based on timing requirements indicated by a register transfer level description, and
   uses a second voltage in performing timing analysis for the slow corner, the second voltage being higher than the first voltage.

2. The semiconductor integrated circuit of claim 1, wherein the process also
   determines a third voltage for a fast corner based on timing requirements indicated by the register transfer level description, and
   uses a fourth voltage in performing timing analysis for the fast corner, the fourth voltage being lower than the third voltage.

3. The semiconductor integrated circuit of claim 1, wherein the process also specifies requirements for the integrated circuit, the requirements including a signal path providing for a speed comparison function, the speed comparison function used for affecting an operational characteristic of power lines of the integrated circuit.

4. The semiconductor integrated circuit of claim 2, wherein the process also specifies requirements for the integrated circuit, the requirements including a signal path providing for a speed comparison function, the speed comparison function used for affecting an operational characteristic of power lines of the integrated circuit.

5. The semiconductor integrated circuit of claim 4, wherein the operational characteristic of power lines of the integrated circuit comprises a voltage.

6. The semiconductor integrated circuit of claim 5, wherein the speed comparison function affects the operational characteristic of power lines of the integrated circuit to produce the second voltage when the signal path operates at the slow corner and the fourth voltage when the signal path operates at the fast corner.

7. The semiconductor integrated circuit of claim 2, wherein the second voltage and the fourth voltage comprise substantially the same voltage.

8. The semiconductor integrated circuit of claim 2, wherein the second voltage and the fourth voltage comprise different voltages.

9. The semiconductor integrated circuit of claim 2, wherein the process also specifies requirements for the integrated circuit including dynamic voltage scaling, translates the requirements to generate the register transfer level description, synthesizes the register transfer level description, and performs place and route operations on a gate level representation provided by the synthesized register transfer level description, utilizing the fourth voltage in order to determine whether a circuit representation provided by the place and route operations meets a timing requirement for the fast corner.

10. The semiconductor integrated circuit of claim 9, wherein the process synthesizes the register transfer level description by selecting cells from a standard cell library to implement functions in accordance with the register transfer level description, the selection of cells based in part on timing requirements indicated by the register transfer level description and determines if the selected cells meet the timing requirements indicated by the register transfer level description for both the slow corner and the fast corner, the slow corner being determined at least in part by a slow process parameter, a slow voltage parameter, and a slow temperature parameter, the fast corner being determined at least in part by a fast process parameter, a fast voltage parameter, and a fast temperature parameter, with the slow voltage parameter approximate the fast voltage parameter.

11. The semiconductor integrated circuit of claim 1, wherein the circuit for adaptive power supply regulation comprises a voltage regulation circuit.

12. The semiconductor integrated circuit of claim 1, wherein the process also specifies requirements for the integrated circuit including dynamic voltage scaling, translates the requirements to generate the register transfer level description, synthesizes the register transfer level description, and performs place and route operations on a gate level representation provided by the synthesized register transfer level description, utilizing the second voltage in order to determine whether a circuit representation provided by the place and route operations meets a timing requirement for the slow corner.

* * * * *